(12) United States Patent
Nagasawa

(10) Patent No.: US 7,166,523 B2
(45) Date of Patent: Jan. 23, 2007

(54) SILICON CARBIDE AND METHOD OF MANUFACTURING THE SAME

(75) Inventor: Hiroyuki Nagasawa, Hachiouji (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 10/890,155

(22) Filed: Jul. 14, 2004

(65) Prior Publication Data

US 2004/0266057 A1    Dec. 30, 2004

Related U.S. Application Data

(62) Division of application No. 09/924,872, filed on Aug. 9, 2001, now abandoned.

(30) Foreign Application Priority Data

Aug. 10, 2000   (JP)   ............................. 2000/242171

(51) Int. Cl.
*H01L 21/36*   (2006.01)

(52) U.S. Cl. ................ 438/478; 438/479; 438/483

(58) Field of Classification Search ............... 438/478, 438/479, 483, 505, 105
See application file for complete search history.

(56) References Cited

U.S. PATENT DOCUMENTS

| | | | | |
|---|---|---|---|---|
| 1,561,641 A | * | 11/1925 | Farish | 501/90 |
| 2,205,308 A | * | 6/1940 | Pirani | 264/29.6 |
| 2,431,326 A | * | 11/1947 | Heyroth | 252/516 |
| 2,907,972 A | * | 10/1959 | Skuza et al. | 338/332 |
| 3,035,325 A | * | 5/1962 | Nicholson et al. | 264/29.1 |
| 3,148,128 A | * | 9/1964 | Fagnant | 202/129 |
| 3,166,614 A | * | 1/1965 | Taylor | |
| 3,205,043 A | * | 9/1965 | Taylor | 423/345 |
| 4,504,453 A | * | 3/1985 | Tanaka et al. | 423/345 |
| 4,599,789 A | * | 7/1986 | Gasner | 438/224 |
| 5,103,285 A | * | 4/1992 | Furumura et al. | 257/77 |
| 5,221,411 A | * | 6/1993 | Narayan | 117/44 |

(Continued)

FOREIGN PATENT DOCUMENTS

JP          57200299 A   *   12/1982

(Continued)

OTHER PUBLICATIONS

R.S. Kem et al.; "Deposition and Doping of Silicon Carbide By Gas-Source Molecular Beam Epitaxy"; Appl. Phys. Lett. 71 (10); Sep. 8, 1997; pp. 1356-1358.

(Continued)

*Primary Examiner*—Laura M. Schillinger
(74) *Attorney, Agent, or Firm*—Sughrue Mion, PLLC

(57) ABSTRACT

In a method of manufacturing a silicon carbide substance, such as a film, a layer, a semiconductor, which is doped with an impurity, a carbonization process is executed after formation of a doped silicon substance which is obtained by carrying out a silicon deposition process and by a doping process of the impurity. Both the silicon deposition and the doping processes may be simultaneously or separately carried out prior to the carbonization process or may be continued during the carbonization process also. At any rate, the carbonization process is intermittently carried out. A unit process of composed of a combination of the silicon deposition process, the doping process, and the carbonization process may be repeated a plurality times, for example, 2000 times.

12 Claims, 6 Drawing Sheets

U.S. PATENT DOCUMENTS

| | | | |
|---|---|---|---|
| 5,415,126 A * | 5/1995 | Loboda et al. | 117/88 |
| 5,471,946 A | 12/1995 | Scholz et al. | |
| 5,562,774 A | 10/1996 | Breidenbach et al. | |
| 5,581,087 A | 12/1996 | Uddin et al. | |
| 5,610,411 A * | 3/1997 | Takasu | 257/77 |
| 5,670,414 A * | 9/1997 | Fang et al. | 117/93 |
| 5,670,796 A | 9/1997 | Nishibayashi et al. | |
| 5,671,914 A * | 9/1997 | Kalkhoran et al. | 257/77 |
| 5,759,908 A | 6/1998 | Steckl et al. | |
| 6,049,098 A | 4/2000 | Sato | |
| 6,075,259 A | 6/2000 | Baliga | |
| 6,096,607 A | 8/2000 | Ueno et al. | |
| 6,156,581 A * | 12/2000 | Vaudo et al. | 438/22 |
| 6,300,556 B1 * | 10/2001 | Yamagishi et al. | 136/251 |
| 6,306,211 B1 * | 10/2001 | Takahashi et al. | 117/86 |
| 6,440,823 B1 * | 8/2002 | Vaudo et al. | 438/478 |
| 6,533,874 B1 * | 3/2003 | Vaudo et al. | 148/33.5 |
| 6,548,313 B1 * | 4/2003 | Ravi et al. | 438/6 |
| 6,562,416 B2 * | 5/2003 | Ngo et al. | 427/534 |
| 6,750,119 B2 * | 6/2004 | Chu et al. | 438/479 |
| 6,821,617 B2 * | 11/2004 | Odaka et al. | 428/332 |
| 6,908,866 B2 * | 6/2005 | Chu et al. | 438/778 |
| 6,943,095 B2 * | 9/2005 | Vaudo et al. | 438/479 |
| 6,974,751 B2 * | 12/2005 | Ota | 438/299 |
| 2002/0019117 A1 * | 2/2002 | Nagasawa | 438/505 |
| 2002/0166502 A1 * | 11/2002 | Vaudo et al. | 117/89 |
| 2003/0036245 A1 * | 2/2003 | Odaka et al. | 438/406 |
| 2004/0161911 A1 * | 8/2004 | Chu et al. | 438/479 |
| 2004/0266057 A1 * | 12/2004 | Nagasawa | 438/105 |
| 2006/0160372 A1 * | 7/2006 | Dorfman | 438/761 |
| 2006/0205189 A1 * | 9/2006 | Messenger et al. | 438/479 |

FOREIGN PATENT DOCUMENTS

| | | |
|---|---|---|
| JP | 60-264399 | 12/1985 |
| JP | 61-242998 | 11/1986 |
| JP | 63095105 A * | 4/1988 |
| JP | 01162326 A * | 6/1989 |
| JP | 2-172895 | 7/1990 |
| JP | 5-1380 | 10/1993 |
| JP | 6-338629 | 12/1994 |
| JP | 8-188408 | 7/1996 |
| JP | 09082643 A * | 3/1997 |
| JP | 10-297998 | 11/1998 |
| JP | 10330732 A * | 12/1998 |
| JP | 11-060389 | 3/1999 |
| JP | 11-162850 | 6/1999 |
| JP | 9-63968 | 10/2000 |
| JP | 2004343133 A * | 12/2004 |

OTHER PUBLICATIONS

Jin-Hyo Boo et al.; "Low-Temperature Epitaxial Growth of Cubic SiC Thin Films On Si(111) Using Supersonic Molecular Jet of Single Source Precursors"; Thin Solid Films 343-344 (1999); pp. 650-655.

Tatsuo Yoshinobu et al.; "Atomic Level Control In Gas Source MBE Growth of Cubic SiC"; Journal of Crystal Growth; Nos. 1/4; Part I; Jan. 1990; pp. 520-524.

Tsunenobu Kimoto et al.; "Incorporation Mechanism of N, Al, and B Impurities in Chemical Vapor Deposition of SiC"; Applied Physics Letters; No. 16; Oct. 16, 1995; pp. 2385-2387.

D. Larkin, et al, Site-Competition Epitaxy for Superior Silicon Carbide Electronics, Applied Physics Letter 65, Sep. 26, 1994, pp. 1659-1961.

V. Cimalla et al.; "Growth of Thin β-SiC Layers by Carbonization of Si Surfaces by Rapid Thermal Processing"; Materials Science & Engineering B Solid-State Materials for Advanced Technology; Nos. 1/3; Jan. 1995; pp. 170-175.

J.J. Sumakeris et al.; "Layer-By-Layer Growth of SiC at Low Temperatures"; Thin Solid Films; No. 1 /2; Mar. 25, 1993; pp. 219-224.

J. Zhang et al.; "Nitrogen Impurity Incorporation Behavior In A Chimney HTCVD Process: Pressure And Temperature Dependence"; Materials Science and Engineering B61-62 (1999); pp. 151-154.

* cited by examiner

SILICON CARBIDE AND METHOD OF MANUFACTURING THE SAME

This is a divisional of application Ser. No. 09/924,872 filed Aug. 9, 2001 now abandoned. The entire content of the disclosure of which is incorporated herein by reference.

BACKGROUND OF THE INVENTION

This invention relates to silicon carbide and in particular, to a method of manufacturing a film of silicon carbide, a device including the silicon carbide, an ingot of silicon carbide, and the like. In this event, it is to be noted that the silicon carbide is used for a substrate material of a semiconductor device, a sensor, a dummy wafer in a semiconductor manufacturing process, an X-ray mask, a solar cell, and so on.

It is known in the art that silicon carbide itself is a semiconductor which has a forbidden band as wide as 2.2 eV or more and which is formed by thermally, chemically, and mechanically stable crystals. In addition, consideration has been made about applications of the silicon carbide to a semiconductor substance which is used on conditions of a high frequency and a high electric power because the silicon carbide has a high thermal conductivity. As a method of manufacturing the silicon carbide, have been known in the art the Acheson method and the sublimation and recrystallization method (will be also called an improved Lely method). Specifically, the Acheson method is for reacting silicon on heated coke to deposit the silicon carbide on the surface of the coke while the sublimation and recrystallization method is for heating the silicon carbide obtained by the Acheson method to sublimate and thereafter recrystallize it. In addition, is also known a liquid deposition method which melts silicon within a carbon crucible to pulling the silicon carbide with reacting floating carbon in the crucible with the silicon.

Moreover, any other methods have also been proposed so as to obtain a silicon carbide film which has a high purity and reduced crystal defects. Specifically, as such methods, have been known a chemical vapor deposition (CVD) method and an atomic layer epitaxy (ALE) method. In the CVD method, the silicon carbide is deposited on a surface of a substrate by thermally reacting a carbon source gas with another silicon source gas in a normal or a reduce pressure atmosphere. On the other hand, silicon source molecules and carbon source molecules are alternately adsorbed on a substrate surface and epitaxial growth of the silicon carbide proceeds with crystallinity of the substrate kept unchanged in the silicon carbide.

Herein, it is to be noted that, when the silicon carbide is used as a material of a semiconductor device, controlling an impurity is extremely important. For example, let the silicon carbide be used as a substrate for a power semiconductor device of a discrete type, such as a Schottky-barrier diode. In this event, the device has a series resistance or an on-resistance when the device is put in an on-state and the on-resistance is preferably small because of a reduction of a power loss within the device. In order to decrease the on-resistance, the substrate must be doped with an impurity of an amount as large as $10^{21}/cm^3$ at maximum.

On the other hand, consideration should be made about a breakdown voltage of a semiconductor device. Such a breakdown voltage of the semiconductor is generally proportional to −0.5 power (namely, minus square root) of the impurity concentration. Taking this into account, the impurity concentration should be reduced to $1\times10^{14}/cm^3$ at a portion of the device at which an electric field is concentrated.

In the meanwhile, a thermal diffusion method is used to dope the impurity into the substrate on manufacturing the semiconductor device which uses silicon as a base material. The thermal diffusion method is for adding the impurity into the substrate by coating an impurity on a substrate surface or by exposing the substrate in an impurity atmosphere and by thereafter heating the substrate. However, such a thermal diffusion method can not be applied to a silicon carbide substrate. This is because a diffusion coefficient within the silicon carbide is extremely slow as compared with that within the silicon. This make it very difficult to diffuse an impurity to a depth (deeper than 1 μm with a concentration range between $1\times10^{14}$ and $1\times10^{21}/cm^3$) which is available for manufacturing the semiconductor device.

Under the circumstances, an ion injection method is usually used to add an impurity to silicon carbide and is useful to widely control an impurity concentration. However, restriction is inevitably imposed in the ion injection method on a distribution of impurity along a depth direction due to a range of injected ions. In other words, the distribution of impurity depends on the range of the injected ions. Taking this into consideration, Japanese Unexamined Patent Publication No. Hei.11-503571, namely, 503571/1999 discloses a method of introducing a dopant into a semiconductor layer of silicon carbide. More specifically, the method should have a step of ion injecting a dopant into a semiconductor layer at a low temperature and a step of annealing the semiconductor layer at a high temperature. In this event, the ion injecting step is performed at the low temperature so that an amorphous layer is formed near to a surface of the semiconductor while the annealing step is performed at the high temperature so that the dopant is diffused into an un-injected layer laid under the amorphous layer. Even when this method is used, it is difficult to diffuse the impurity with a high concentration over a whole of the substrate.

In addition, injected ions are insufficient with electrical activation and the ion injection brings about the crystal defects within the silicon carbide. Under the circumstances, proposal has been made in Japanese Unexamined Patent Publication No. Hei 12-068225, namely, 068225/2000 about a method of additionally ion injecting carbon atoms (C) to improve electrical activation of acceptors injected into the silicon carbide. This method is also effective to suppress diffusion resulting from heat treatment. Furthermore, Japanese Unexamined Patent Publication No. Hei 11-121393, namely, 121393/1999 discloses a method of forming a mask of $SiO_2$ on a silicon surface of a silicon carbide substrate and thereafter carrying out ion injection of nitrogen as impurity element. After injection of the impurity, this method should further carry out ion injection (channeling injection) from a direction perpendicular to the silicon surface and another ion injection (random injection) from another direction oblique from the perpendicular direction by 7 degrees. As pointed in Japanese Unexamined Patent Publication No. Hei 11-121393, when phosphorus atoms are ion injected into the semiconductor of silicon carbide, the temperature on the ion injection should be kept at a high temperature, such as 1200° C. or more.

Herein, let an impurity be added all over a substrate. In this case, use is made of a method which forms silicon carbide simultaneously with doping an impurity and which may be called in-situ doping. In such in-situ doping, restrictions are inevitably imposed on an impurity source and a concentration to be added. For example, disclosure is made in Japanese Unexamined Patent Publication No. Hei 09-063968 about a method which causes a boron inclusion gas to flow simultaneously with feeding a mix gas of carbon and silicon and which serves to grow a semiconductor layer of p-silicon carbide in a vapor phase. In this event, when a supply quantity of carbon and a supply quantity of silicon, both of which contribute to crystal growth, stand for $Q_C$ and $Q_{Si}$, respectively, the following relationship should hold:

$$1 < Q_C/Q_{Si} < 5.$$

As regards the semiconductor layer of the p-silicon carbide deposited in the above-mentioned manner, the following relationship between atomic density $d_C$ of the carbon and atomic density $d_{Si}$ of the silicon should be satisfied:

$$1 < d_C < d_{Si} < 32/31.$$

As mentioned in Japanese Unexamined Patent Publication No. Hei 10-507734, namely, 507734/1998, trialkylboron should be used as an organic boron compound in a CVD process or a sublimation process. Specifically, let use be made of the organic boron compound which has, in a molecule, at least one boron atom chemically bonded to at least one carbon atom, when doping is carried out in a single crystal of silicon carbide by each of the CVD and the sublimation process. The above-mentioned Publication points out that trialkylboron effectively acts as such an organic boron compound.

In order to vary a concentration of nitrogen as an impurity over a wide range by using in-situ doping technique, Applied Physics letters 65(13), 26 (1994) reports about varying a concentration of carbon which competes with nitrogen in an occupancy ratio of crystal lattices in silicon carbide. In this case, since the concentration of nitrogen arranged in positions of the crystal lattice in place is sensible against the concentration of carbon, a composition ratio of a silicon source and a carbon source should be strictly controlled on growing the silicon carbide. This makes mass-production of the silicon carbide difficult.

Alternatively, let an impurity be doped with silicon carbide by using the sublimation and recrystallization method. In this event, silicon carbide powder and an impurity source (such as Al, B) which act as raw materials should be mixed at a predetermined ratio and sublimated to be recrystallized on a seed crystal. Herein, it is noted that a vapor pressure of the impurity source is very higher than that of the silicon carbide at a sublimation temperature. In consequence, an impurity concentration in the silicon carbide inevitably becomes high at a beginning of silicon carbide growth and becomes low at an end of the growth because the impurity source is wasted and extinct.

Such a variation of the impurity concentration gives rise to a variation of resisitivity among silicon carbide substrates when the silicon carbide formed by the sublimation and recrystallization method is sliced to obtain the silicon carbide substrates. This makes it difficult to realize a stable characteristic of a device. In addition, the silicon carbide grown by the sublimation and recrystallization method does not always have a flat surface and a sharp pn junction or a flat pn junction can not be attained by the use of such silicon carbide.

In the conventional in-situ doping which dopes an impurity during growing the silicon carbide by a vapor growth method, capturing the impurity proceeds simultaneously with growth of silicon carbide. Taking this into consideration, let a pn junction be formed by the use of the above-mentioned in-situ doping. In this case, impurity materials should be switched from one to another during the doping. On switching the impurity materials, a previous impurity gas is inescapably left in a reaction system at the beginning of doping another impurity. In consequence, it is difficult to obtain a sharp pn junction which has a clear junction boundary between p and n regions. In addition, donor impurities and acceptor impurities coexist in a portion adjacent to the junction boundary and such coexistence brings about a high compensation degree and which makes it difficult to enhance mobility in the pn junction.

Moreover, gas flows and the like give rise to an uneven distribution of impurity concentrations in a plane and a uniform impurity concentration can not be obtained over a wide range. Hence, the impurity concentrations can not be strictly controlled and the silicon carbide which has desired impurity concentration distributions can not be attained with a high yield.

SUMMARY OF THE INVENTION

In order to solve the above-mentioned problems, it is an object of this invention to provide a method of manufacturing silicon carbide, which can dope an impurity over an area wider than four inches in diameter with high controllability kept and which can achieve high productivity.

It is another object of this invention to provide a method of the type described, which can dispense with or substantially eliminate any restrictions related to impurity sources, impurity concentrations, and/or depths of impurity doped regions.

It is still another object of this invention to provide silicon carbide and a semiconductor device manufactured by the above-mentioned method.

A method to which this invention is applicable is for use in depositing a silicon carbide on a substrate from a vapor phase or a liquid phase. According to a first aspect of this invention, the method comprises the steps of depositing a silicon layer on the substrate, doping the silicon layer with an impurity composed of at least one element selected from a group consisting of N, B, Al, Ga, In, P, As, Sb, Se, Zn, O, Au, V, Er, Ge, and Fe, to form a doped silicon layer, and carbonizing the doped silicon layer into a silicon carbide layer of the silicon carbide doped with the impurity.

According to a second aspect of this invention, the silicon layer depositing step, the doping step, and the carbonizing step are carried out during epitaxially growing a thin film on the substrate by the use of a chemical vapor deposition technique. The silicon layer deposition step being carried out by using a gas of a silane group or a dichlorosilane group as a silicon raw material while the carbonizing step is carried out by the use of an unsaturated carbonhydrate gas.

According to a third aspect of this invention, the silicon layer depositing step is followed by the doping step and the carbonizing step is carried out after the doping step.

According to a fourth aspect of this invention, the silicon layer depositing step and the doping step are simultaneously carried out and are followed by the carbonizing step.

According to a fifth aspect of this invention, the silicon layer depositing step and the doping step are simultaneously carried out while the carbonizing step is carried out when a predetermined time lapses after the start of both the silicon depositing and the doping steps.

According to a sixth aspect of this invention, the silicon carbide layer doped with the impurity is deposited to a desired thickness by repeating a process unit composed of the silicon depositing step, the doping step, and the carbonizing step a plurality of times.

According to a seventh aspect of this invention, an amount of impurity is varied during each doping step of the unit processes mentioned in the sixth aspect to provide a plurality of silicon carbide layers which have different impurity concentrations in a thickness direction, respectively.

According to an eighth aspect of this invention, the doping step controls an amount of impurity so that impurity concentrations in the silicon carbide fall within a range between $1 \times 10^{13}/cm^3$ to $1 \times 10^{21}/cm^3$.

According to a ninth aspect of this invention, the doping step controls an amount of impurity so that an impurity concentration gradient falls within a range between $10 \times 10^{18}/cm^4$ and $4 \times 10^{24}/cm^4$ in a thickness direction of the silicon carbide layer.

According to a tenth aspect of this invention, the substrate has a surface which is structured by either one of a single crystal silicon, a silicon carbide of a cubic system, and a silicon carbide of a hexagonal system while the silicon carbide layer deposited on the surface of the substrate is structured by silicon carbide of a cubic system or a hexagonal system.

According to an eleventh aspect of this invention, the method further comprises the step of removing the substrate from the silicon carbide layer after the formation of the doped silicon carbide, to leave a silicon carbide wafer.

According to a twelfth aspect of this invention, the doping step of each process unit is carried out by varying a species of the impurities from one to another at each process unit to provide a pn junction in the doped silicon carbide layer.

According to thirteenth aspect of this invention, the method further comprises the steps of using, as a seed crystal, the doped silicon carbide obtained in claim 1 and further growing a silicon carbide on the seed crystal by a vapor deposition method, a sublimation re-crystallization method, or a liquid deposition method.

According to a fourteenth aspect of this invention, a silicon carbide has a thickness and a region which has an impurity concentration gradient between $1 \times 10^{22}/cm^4$ and $4 \times 10^{24}/cm^4$ in the thickness direction.

According to a fifteenth aspect of this invention, a semiconductor device has the silicon carbide manufactured by the method according to the first aspect mentioned above.

According to a sixteenth aspect of this invention, a semiconductor device is structured by the silicon carbide according to the fourteenth aspect.

In the first through the fifth aspects of this invention, the impurity doped silicon is carbonized into the silicon carbide doped with the impurity. With this method, it is possible to easily and accurately dope a desired impurity into the silicon with a high concentration because the impurity can easily be doped into the silicon in comparison with the silicon carbide. More specifically, the impurity and the impurity concentration are limited which can be doped into the silicon carbide while the silicon is easily doped with various kinds of impurities in a high concentration. This shows that impurity doping can be done to a high concentration which exceeds limits determined for a diffusion coefficient and a soluability of the impurity in the silicon carbide.

In the above-mentioned aspects, an amount of the impurity finally doped into the silicon carbide layer is coincident with an amount of the impurity previously doped into the silicon. Therefore, the amount of the impurity in the silicon carbide can be strictly controlled by impurity doping conditions, such as a doping amount of the impurity and a supply time, on forming the silicon layer. Moreover, it is to be noted that, since the diffusion coefficient of the impurity in the silicon carbide is by far lower than that in the silicon, it is possible to prevent an impurity distribution of the impurity in the silicon carbide from being disturbed due to inner diffusion. Accordingly, a doping region of the impurity can be precisely controlled by considering a thickness of a previously deposited silicon layer and may exceed a thickness not thinner than 1 μm. In addition, an impurity concentration in the silicon carbide can be readily varied over a very wide range, as mentioned in the eighth aspect of this invention. This makes it possible to apply this invention to a wide variety of semiconductors.

Herein, the silicon layer deposition step and the impurity doping step must be executed in the absence of any carbon material. In the absence of any carbon material, the impurity doping step may be carried out simultaneously with or after the silicon layer deposition step. At any rate, the carbonization step should be carried out after both the silicon deposition step and the impurity doping step. The reasons will be described later in detail.

Let carbon materials and impurity materials be simultaneously introduced onto the substrate having the previously silicon layer. In this event, the silicon carbide is predominantly formed on the silicon layer as compared with impurity doping. This is because carbonization takes place on a surface of a silicon as a surface phenomenon while impurity diffusion is progressive in proportion to a square root of a time and, as a result, the carbonization is quickly finished within a short time in comparison with impurity doping. Therefore, it is difficult to sufficiently dope an impurity in the presence of carbon. Moreover, since the carbon material quickly sticks to the substrate surface, diffusion of the impurity materials can not be prevented into the substrate. From this fact, it is understood that the impurity materials should be doped into the silicon layer deposited on the substrate in the absence of the carbon materials in order to sufficiently dope impurities.

In this case, the silicon materials and the impurity materials may be simultaneously introduced. The carbon materials may be introduced onto the substrate after deposition of the silicon layer doped with the impurities. During the carbonization step, the impurity materials may be introduced together with the carbon materials. This is because carbonization is predominantly caused to occur even when the impurity and the carbon materials coexist and, as a result, this situation is similar to the case where the carbon materials alone are introduced.

In addition, the silicon materials may coexist with the carbon materials during the carbonization step as long as the carbon materials and the silicon materials are supplied within a predetermined flow rate range which is determined by a ratio of attachment coefficients. The reasons will be as follows. Within the predetermined flow rate range, the carbon materials act to form an adsorption layer on a substrate surface and the adsorption layer serves to prevent formation of the silicon carbide even when the carbon and the silicon materials are simultaneously given.

In order to deposit a thin film from a vapor phase or a liquid phase, may be used a chemical vapor deposition method (CVD), a molecular beam epitaxy (MBE) method, a liquid-phase epitaxy (LPE) method, or the like. The substrate or base may have a silicon, a silicon carbide, TiC, a sapphire, or the like on at least surface thereof.

As the impurities doped, may be exemplified N, B, Al, Ga, In, P, As, Sb, Se, Zn, O, Au, V, Er, Ge, and Fe. Among others, the third group of elements, such as B, Al, Ga, In, act as acceptors to form a p-type semiconductor while the fifth group of elements, such as N, P, As, Sb, act as donors to form an n-type semiconductor. In addition, the fourth group of elements, such as Se, acts to form an energy level in a forbidden band due to a difference of electron affinities and to vary an electric resistance. The other elements, such as Zn, O, Au, V, Ge, Fe, serve to form deep energy levels and, as a result, to vary a life time of minority carriers and resistivity.

The above-enumerated impurities may be used individually or combined. For example, even when the impurities are of the same type to act as donors, acceptors, such impurities of the same type often form different energy levels in the forbidden band and provide different temperature variations of resistivity from each other. In the case where the resistivity at a certain temperature is to be adjusted, a plurality of the impurities of the same type may be added simultaneously. Specifically, two elements, for example, N and P, may be selected from the fifth group of elements mentioned above and be added simultaneously.

Alternatively, a donor and an acceptor may be added at the same time to compensate for carriers and, as a result, to increase the resistivity. This technique makes it possible to form, for example, an i (intrinsic) layer in a PIN diode. The donor and the acceptor may be, for instance, N and B, respectively. In order to avoid an inevitable increase of resistivity resulting from an impurity inescapably invaded during crystal growth, another impurity that has an inverse characteristic to the impurity may be added. On simultaneously adding the donor and the acceptor, adjustment may be carried out such that cancellation is made about natures of the impurities, which is helpful to obtain a silicon carbide of a high resistivity.

The above-mentioned silicon layer deposition step, impurity doping step, and carbonization step may be executed by controlling supplies of raw materials of a vapor phase or a liquid phase. For example, such adjustment may be made about a concentration ratio of impurity sources mingled in the raw material of the silicon carbide and a time of mixing the impurities.

As gases of a silane group and a dichlorosilane group, are exemplified dichlorosilane, tetrachlorosilane, trichlorosilane, hexachlorosilane, or the like. As unsaturated hydrocarbon gases, are exemplified acetylene, ethylene, propane, or the like. Using these raw materials can reduce a temperature of forming a silicon carbide, widen a tolerance range accepted for varying a gas flow rate, and improve crystallinity of the silicon carbide obtained.

In the case where manufacturing is made in accordance with the second aspect, a base sheet, such as a substrate during reaction, is kept at a temperature range between 900° C. and 1400° C., preferably, between 1000° C. and 1400° C. When the reaction temperature is too high, the silicon is fused when it is used as the base sheet while, when the reaction temperature is too low, the reaction speed becomes too slow.

According to the sixth aspect, it is possible to attain an impurity doped layer which has an optional or desirable concentration profile. The method according to this aspect dispenses with any limitations related to impurities when they are diffused into the silicon.

The seventh aspect can realize a desirable concentration gradient that may be, for example, a sharp concentration gradient which can not be obtained by a conventional method. Such a concentration gradient may be a steep concentration gradient defined by the ninth aspect mentioned above.

The tenth aspect according to this invention can realize an excellent silicon carbide. When the silicon carbide is deposited on a silicon carbide substrate, the silicon carbide substrate may be used as a silicon carbide substrate for a semiconductor as it is. Such a silicon carbide substrate may be formed by the Acheson method or the sublimation and recrystallization method or may be a carbonized silicon surface. In this connection, such a substrate and a surface may be collectively called a base body.

The base body may be a substrate which has a surface with a slightly inclined crystal normal axis (namely, the substrate with an off angle). Such a substrate may be exemplified by a silicon substrate of (100) which has a surface normal angle slightly inclined from [001] direction towards [110] one. In addition, the substrate may have a plurality of undulations extended in parallel with one another on a surface in a predetermined single direction. As such a substrate, are exemplified a silicon substrate having undulations extended in parallel in a direction of [011] on a substrate surface defined by (001) plane, a silicon carbide substrate of a cubic system, or the like. The above-enumerated substrate is helpful to reduce defects on a silicon carbide layer to be deposited thereon and therefore serves to obtain a silicon carbide of a high quality.

The twelfth aspect of this invention is helpful to obtain a silicon carbide semiconductor wafer that has a desirable and uniform impurity concentration or an impurity concentration distribution strictly controlled. At any rate, the base body may be removed. When the silicon substrate is used as the base body, removal of the base body can be accomplished after deposition of the silicon carbide layer on the silicon substrate by etching or cutting the base body. When a thick silicon carbide layer is deposited on the substrate, the deposited thick silicon carbide layer may be sliced by a wiring saw and so on to be left as a wafer. More particularly, when the wafer has a diameter of 6 inches, the thickness of the silicon carbide layer may be, for example, 0.65 mm. On the other hand, when the wafer has a diameter of 5 inches, the silicon carbide layer may be 0.5 mm thick. Alternatively, the silicon carbide layer may be 0.36 mm thick or so when the wafer has a diameter of 3 inches or 4 inches. From this fact, it is readily understood that the impurity concentration can be precisely controlled over a whole of the wafer even when the wafer is wide in area and the silicon carbide layer is comparatively thick. Specifically, it is possible to reduce a variation of the impurity concentration over a whole surface (wider than 4 inches in diameter) to less than 5% and to reduce a variation of the impurity concentration in a thickness direction to less than 5%. The variation of the impurity concentration represented by % is calculated by:

$$\text{(variation of the impurity concentration)} = [(\text{maximum concentration} - \text{minimum concentration})/(\text{average concentration})] \times 100 \ (\%).$$

The impurity concentration gradient may be precisely controlled in accordance with the ninth or the fourteenth aspect of this invention mentioned above.

The twelfth aspect of this invention serves to form a pn junction which is precisely controlled in impurity concentration and is helpful to manufacture a desirable semiconductor device with a good yield in bulk.

The thirteenth aspect of this invention can suitably select an impurity concentration of the silicon carbide used as a seed crystal. This enables to control electric resistivity to an appropriate value and, thereby, serves to avoid adhesion of particles appearing during the crystal growth. As a result, an excellent silicon carbide ingot can be obtained.

The fourteenth aspect of this invention makes it possible to easily obtain a slice of a desired concentration by forming a silicon carbide having a concentration gradient in a thickness direction and by cutting the silicon carbide into a plurality of slices. This is effective to widen a control width of an inner electric field within a semiconductor and to design an operating characteristic of a semiconductor device.

The fifteenth aspect of this invention serves to obtain a power semiconductor or the like which has a high speed, a high efficiency, and a high breakdown voltage.

The sixteenth aspect of this invention serves to manufacture such a semiconductor.

DESCRIPTION OF THE PREFERRED EMBODIMENTS

First Embodiment

Figure 1:
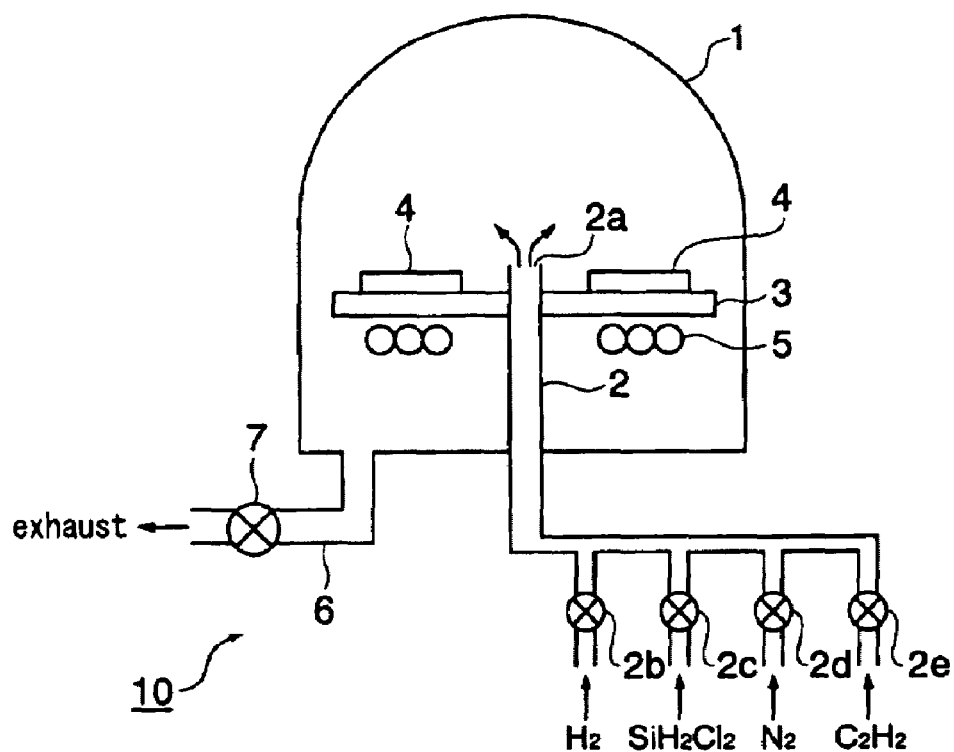
FIG. 1 shows a diagrammatic view for use in describing a CVD device available for a silicon carbide manufacturing method according to this invention.
Figure 2:
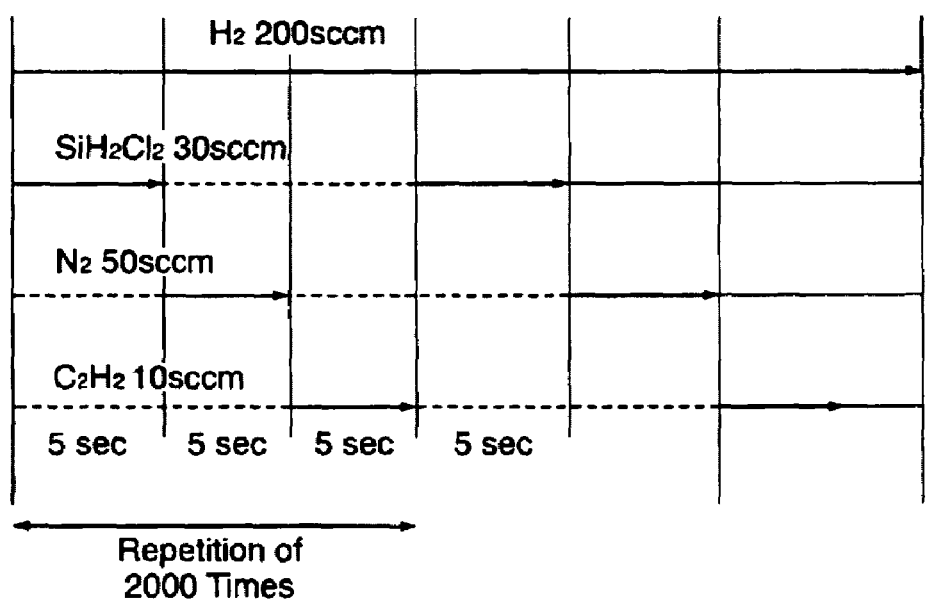
FIG. 2 shows a timing diagram for use in describing a silicon carbide manufacturing method according to a first embodiment of this invention.

Referring to FIGS. 1 and 2, description will be made about a silicon carbide manufacturing method according to a first embodiment of this invention. Herein, it is to be noted that the method according to the embodiment of this invention is executed by the use of a CVD device or apparatus illustrated in FIG. 1 in accordance with a timing chart shown in FIG. 2. In addition, description will be also made about silicon carbide according to this invention.

Briefly, the method according to the first embodiment of this invention is featured by carrying out an impurity doping process after deposition of a silicon layer and by thereafter carrying out a carbonizing process.

The CVD device illustrated in FIG. 1 has a deposition chamber 1 and a gas inlet pipe or conduit 2 which has a nozzle 2a positioned at a center portion of the deposition chamber 1 and standing substantially perpendicularly on the center portion. A plate 3 is fixed to a tip portion of the gas inlet pipe adjacent to the nozzle 2a. A heating member 5 is attached to a lower side of the plate 3 so as to heat substrates 4 or the like placed on an upper side of the plate 3. The substrates 4 serve as base members according to this invention.

Outside of the deposition chamber 1, a gas supply facility is placed so as to supply gases to the gas inlet pipe 2 and has gas supply sources (not shown) of $H_2$ gas, $N_2$ gas, $SiH_2Cl_2$ gas, and $C_2H_2$ gas and valves 2b, 2c, 2d, and 2e connected between the gas inlet pipe 2 and the above-mentioned gas supply sources. In addition, an exhaust pipe 6 is coupled to the deposition chamber 1 and is also coupled to an exhaust pump (not shown) or the like through a pressure control valve 7. Thus, the deposition chamber 1 can be exhausted by the exhaust pump through the pressure control valve 7.

The CVD device illustrated in FIG. 1 is so-called a known reduced CVD device of a cold-wall type and serves to grow a thin film on each substrate 4 in a known manner. Specifically, such growth of the thin film can be accomplished by heating the substrates 4 on the plate 3 by the heating member 5, by exhausting the deposition chamber 1 through the exhaust pipe 6, by supplying a selected one of the gases within the deposition chamber 1 through the nozzle 2a of the gas inlet pipe 2, and by forming a vapor phase within the deposition chamber 1.

The above-mentioned reduced CVD device can manufacture silicon carbide in the following manner. At first, a silicon substrate of a single crystal is prepared as each substrate 4 and has a diameter of six inches and a surface layer on which a {001} plane of the single crystal appears. The silicon substrate is subjected to pre-processing to carbonize the surface layer of the silicon substrate into a thin silicon carbide film. Such a thin silicon carbide film underlies a silicon carbide layer which is grown on the substrate and therefore serves as a buffer layer or an underlying layer of the silicon carbide layer so as to grow the silicon carbide layer of an excellent crystallinity.

Taking the above into consideration, description will be made about the method according to the first embodiment of this invention. At first, after the deposition chamber 1 is exhausted through the exhaust pipe 6, the valves 2b and 2c are opened. As a result, the $H_2$ gas and the $C_2H_2$ gas are introduced at flow rates of 200 sccm and 50 sccm to a pressure of 100 mTorr into the deposition chamber 1, respectively. Under the circumstances, the substrates 4 are heated by the heating member 5 to 1200° C. within about 1 minute. Each resultant surface layer of the substrates 4 is previously carbonized into the silicon carbide film which may be called a previous silicon carbide film. After completion of the previous carbonization, the valve 2e is closed to temporarily stop supplying the $C_2H_2$ gas. Thereafter, the $H_2$ gas is caused to continuously flow at a flow rate of 200 sccm with the substrate temperature kept at 1200° C. In this event, the deposition chamber 1 is kept at the pressure of 60 mTorr by exhausting the deposition chamber 1. To this end, the pressure control valve 7 is controlled so as to adjust an exhaust rate of a gas exhausted through the exhaust pipe 6. Under the circumstances, the following deposition is executed.

As shown in FIG. 2, the $H_2$ gas is caused to continuously flow over a whole processing duration, as mentioned before, while the valve 2c is opened for five (5) seconds to introduce the $SiH_2Cl_2$ gas at a flow rate of 30 sccm into the deposition chamber 1 and to deposit a silicon layer on each substrate 4 subjected to the preprocessing mentioned in the above-mentioned manner. Subsequently, the valve 2c is closed to stop supplying the $SiH_2Cl_2$ gas while the valve 2d is opened to introduce the $N_2$ gas into the deposition chamber 1 at a flow rate of 50 sccm for five (5) seconds, as illustrated in FIG. 2. Such introducing the $N_2$ gas is for adding donor impurities into the silicon layer to obtain a doped silicon layer doped with the nitrogen. Next, the valve 2d is closed to stop supply of the $N_2$ gas while the valve 2e is opened to introduce the $C_2H_2$ gas into the deposition chamber 1 at a flow rate of 10 sccm for five (5) seconds. Such introducing $C_2H_2$ gas serves to carbonize the doped silicon layer into a doped silicon carbide.

Herein, it is assumed that a unit process is defined by a sequence of the silicon layer deposition process, the process of doping the nitrogen into the silicon layer, and the process of carbonizing the doped silicon layer. In this case, the unit process is repeated two thousands (2000) times in the illustrated example. Thus, it has been confirmed that the doped silicon carbide layer of a cubic system is epitaxially grown on the substrate 4 in the above-mentioned process.

Furthermore, it has also been confirmed that the silicon carbide layer is deposited on each substrate 4 to a thickness of 54 micron meters after 8.3 hours lapses and is composed of a single crystal. After deposition of the carbonized doped silicon carbide layer on the silicon substrate, a nitrogen (N) concentration in the doped silicon carbide has been measured by a SIMS (secondary ion mass spectrometer). As a result, it has been proved that the nitrogen concentration is equal to $7.4 \times 10^{19}/cm^3$ and the nitrogen is uniformly distributed in the doped silicon carbide. Furthermore, it has been found out that a concentration of electrons in the doped silicon carbide is as high as $7.2 \times 10^{19}/cm^3$ at a room temperature when it has been measured by the use of a Hall effect. In addition, the resistivity or specific resistance of the doped silicon carbide has been found to be 0.007 $\Omega$cm. Moreover, a variation of the impurity concentration has been 3.7% within a plane and in a depth direction.

Second Embodiment

Figure 3:
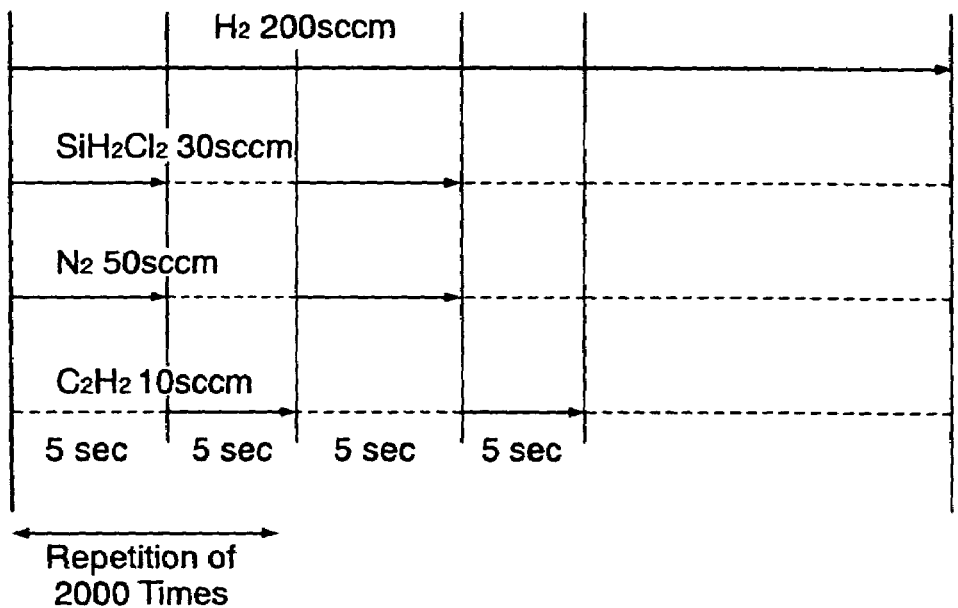
FIG. 3 shows a timing diagram for use in describing a silicon carbide manufacturing method according to a second embodiment of this invention.

Referring to FIG. 3, description will be made about a silicon carbide manufacturing method and silicon carbide according to a second embodiment of this invention. In FIG. 3, the method will is specified by a time diagram for describing timing of supplying raw material gases and is similar to that illustrated in FIG. 2 except that a unit process shown in FIG. 3 is different from that illustrated in FIG. 2. Therefore, description will be mainly directed to the unit process of FIG. 3 and will be omitted about portions or processes common to the first and the second embodiments. Briefly, the method according to the second embodiment of this invention is featured by simultaneously executing both the silicon layer deposition process and the impurity doping process and by thereafter executing the carbonization process.

As shown in FIG. 3, the unit process according to the second embodiment of this invention has a doping process which is executed simultaneously with the depositing process of depositing a silicon layer on a previous silicon carbide layer. Specifically, the valve 2c is opened to supply a $SiH_2Cl_2$ gas to the deposition chamber 1 (FIG. 1) at a flow rate of 50 sccm for five seconds and, at the same time, the valve 2d is opened to supply a nitrogen gas ($N_2$) at a flow rate of 50 sccm for five seconds. This shows that the $SiH_2Cl_2$ gas and the $N_2$ gas are simultaneously introduced or supplied into the deposition chamber 1 (FIG. 1) for five seconds and that the deposition process of the silicon layer and the doping process of the nitrogen are carried out at the same time. Subsequently, both the valves 2c and 2d are concurrently closed to interrupt the supply of the $SiH_2Cl_2$ gas and the nitrogen gas ($N_2$). On the other hand, the valve 2e is opened to supply the $C_2H_2$ gas into the deposition chamber 1 at the flow rate of 10 sccm for five seconds to carbonize the silicon layer doped with the nitrogen. Thus, the unit according to the second embodiment mentioned above is repeated two thousands (2000) times to form the doped silicon carbide layer of the cubic system which is epitaxially grown on the substrate.

As a result of epitaxial growth described above, the doped silicon carbide is deposited on the substrate 4 to a thickness of 54 μm after lapse of 5.6 hours. When the doped silicon carbide has been measured by the SIMS, it has been confirmed that the impurity concentration of nitrogen included in the doped silicon carbide grown on the substrate 4 is as high as $7.4 \times 10^{19}/cm^3$. Herein, the total amount of $N_2$ supplied into the deposition chamber 1 is identical with that of the first embodiment. In addition, the nitrogen has been uniformly distributed within the doped silicon carbide. Moreover, it has been found out that the concentration of electrons in the doped silicon carbide is equal to $7.2 \times 10^{19}/cm^3$ when measurement is made at the room temperature by the Hall effect and that its resistivity is 0.007 $\Omega$cm. The variation of the impurity concentration has been restricted to the ranges of 3.7% within the plane and in the depth direction.

According to this embodiment, it has been proved that the merits according to this invention are not changed even when the deposition process of the silicon and the doping process of doping the impurity into the silicon layer are executed simultaneously or separately. However, it is to be noted that the second embodiment can obtain a similar silicon carbide semiconductor within a time shorter than that needed in the first embodiment.

Third Embodiment

Figure 4:
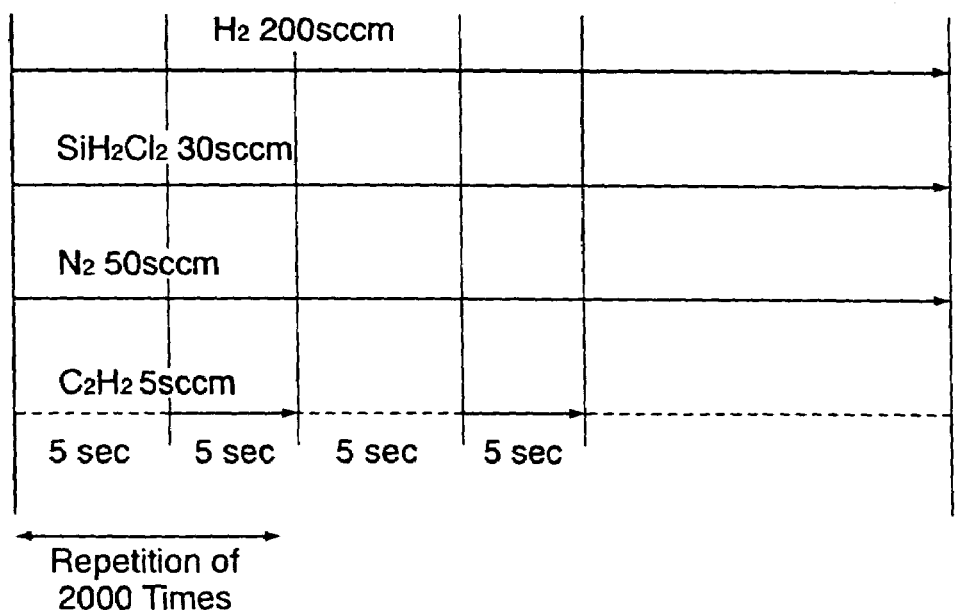
FIG. 4 shows a timing diagram for use in describing a silicon carbide manufacturing method according to a third embodiment of this invention.

Referring to FIG. 4, description will be made about a silicon carbide manufacturing method according to a third embodiment and silicon carbide obtained by the method. The method according to the third embodiment is executed in accordance with a timing diagram illustrated in FIG. 4 and is similar to those illustrated in FIGS. 2 and 3 except that the unit process of FIG. 4 is different from the other embodiments. Simply, the unit process shown in FIG. 4 is featured by simultaneously carrying out the silicon layer deposition process and the impurity doping process and by executing the carbonization process after lapse of a predetermined time duration.

More specifically, the unit process according to this embodiment is composed of the silicon layer deposition process carried out by continuously supplying the $SiH_2Cl_2$ gas at a flow rate of 30 sccm with the valve 2c opened and the impurity or donor doping process carried out by continuously supplying the $N_2$ gas at a flow rate of 50 sccm with the valve 2d opened. In other words, the $SiH_2Cl_2$ gas and the $N_2$ gas are concurrently and continuously supplied into the deposition chamber 1 to continuously and concurrently execute the silicon layer deposition process and the N (donor) or impurity doping process. In this situation, the valve 2e is opened after lapse of 5 seconds from the beginning of supplying both the $SiH_2Cl_2$ and the $N_2$ gases to supply the $C_2H_2$ gas for five seconds at a flow rate of 10 sccm. Thus, the N-doped silicon layer is carbonized. As illustrated in FIG. 4, the supply of both the $SiH_2Cl_2$ and the $N_2$ gases is continued during the supply of $C_2H_2$ gas.

The above-mentioned unit process illustrated in FIG. 4 is repeated 2000 times over 5.6 hours. Thus, it has been found out that epitaxial growth on the substrate 4 (the silicon substrate) is made to deposit the silicon carbide semiconductor film of the cubic system to a thickness of 54 μm. When the impurity within the silicon carbide grown on the silicon substrate was measured by the SIMS, it has been confirmed that the concentration of N in the silicon carbide reached to $7.3 \times 10^{19}/cm^3$ and was uniformly distributed. In addition, the concentration of the electrons in the doped silicon carbide was measured by the Hall effect at the room temperature and was equal to $7.2 \times 10^{19}/cm^3$. The resistivity of the silicon carbide was 0.07 Ωcm. The variation of the impurity concentrations in plane and in the depth direction was about 3.7%.

Thus, according to this embodiment, it has been proved that the impurity doping into the silicon carbide substantially does not take place during the supply of the $C_2H_2$ gas (namely, the carbonization process of the silicon layer). This shows that the impurity doping process and the carbonization process are separately executed in time. According to this embodiment, it is possible to obtain the silicon carbide semiconductor which is similar to that of the first embodiment for a time shorter than the latter. This embodiment can simplify the gas supply control in comparison with the other embodiments.

Fourth Embodiment

Figure 5:
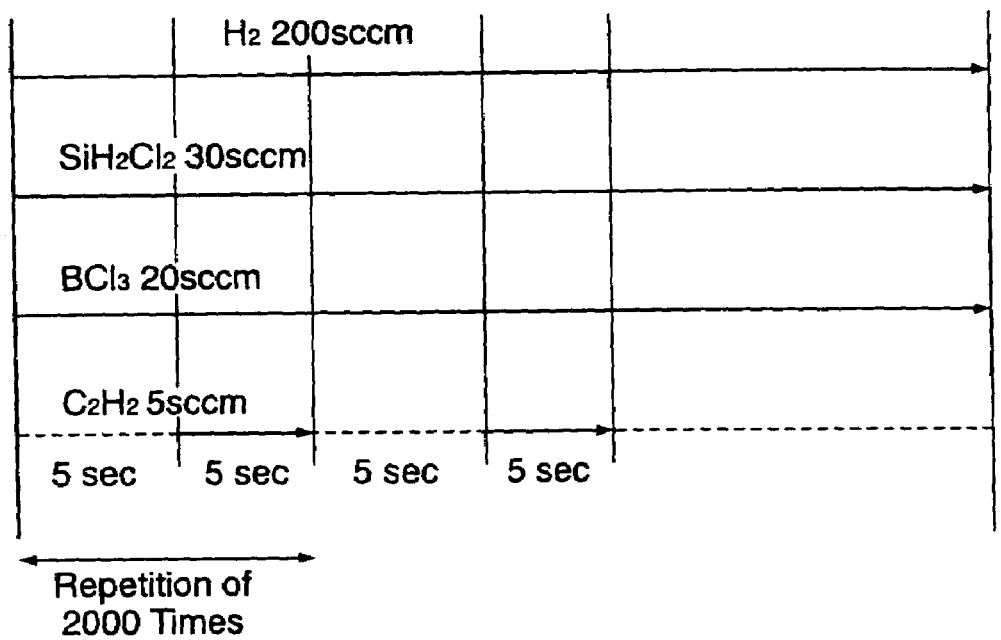
FIG. 5 shows a timing diagram for use in describing a silicon carbide manufacturing method according to a fourth embodiment of this invention.

Referring to FIG. 5, description will be made about a silicon carbide manufacturing method according to a fourth embodiment of this invention. In FIG. 5, raw material gas supply timing is illustrated like in FIGS. 2, 3, and 4. The method illustrated in FIG. 5 is similar to that of FIG. 4 except that $BCl_3$ gas is used instead of $N_2$ gas to dope the acceptors into the silicon layer as the impurity in the unit process and the $C_2H_2$ gas is supplied at a flow rate of 5 sccm.

The unit process is repeated 2000 times for 5.6 hours and, as a result, the silicon carbide is deposited or grown on the silicon substrate 4 to a thickness of 54 μm. The boron concentration within the silicon carbide grown in the above-mentioned manner has been measured by the SIMS and the concentration of electrons was also measured by the Hall effect. As a result, the boron concentration was equal to $1.3 \times 10^{19}/cm^3$ and uniformly distributed into the silicon carbide while the concentration of holes was $1.0 \times 10^{19}/cm^3$. The resistivity of the silicon carbide was 0.01 Ωcm while the variation of the impurity was about 3.7% in plane and in the thickness direction.

Fifth Embodiment

Figure 6:
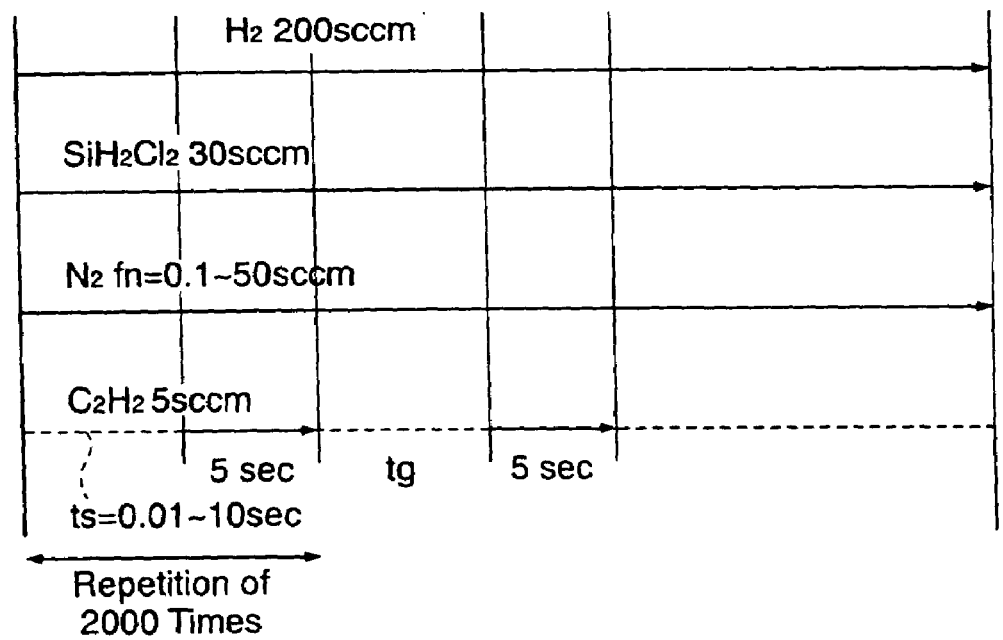
FIG. 6 shows a timing diagram for use in describing a silicon carbide manufacturing method according to a fifth embodiment of this invention.

Referring to FIG. 6, a silicon carbide manufacturing method according to a fifth embodiment of this invention will be described-with reference to a timing diagram of gas supply timing. Herein, description will be made about the silicon carbide manufacturing method and the silicon carbide manufactured by the method. In the illustrated embodiment, it is to be noted that the flow rate (fn) of the $N_2$ gas is varied to manufacture a great number of silicon carbide semiconductors. In this event, a start time instant (ts) of supplying the $C_2H_2$ gas is widely changed from the start time instant of supplying the $SiH_2Cl_2$ gas and the $N_2$ gas, as illustrated in FIG. 6. The other conditions are similar to those illustrated in the third embodiment and will not be described any longer.

Figure 7:
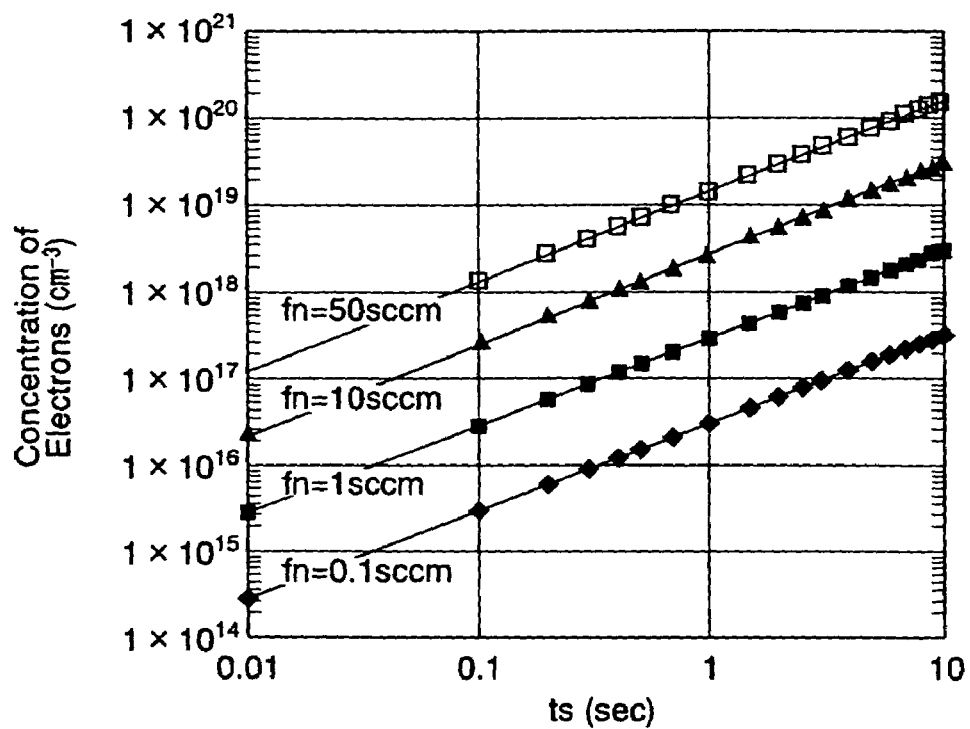
FIG. 7 is a graph which represents concentrations of electrons in silicon carbide obtained by varying start time instants (ts) and flow rates (fn)

Referring to FIG. 7, illustration is made about a relationship between concentrations of electrons and both the start time instant (ts) and the flow rate (fn). In FIG. 7, the great number of the silicon carbide semiconductors have been prepared or manufactured by changing the start time instant (ts) and the flow rate (fn) and have been measured in the manner mentioned before. As is apparent from FIG. 7, it will be readily understood that the concentrations of electrons are substantially proportional to both the start time instant (ts) and the flow rate (fn) and fall within a range between $3 \times 10^{14}/cm^3$ and $1.8 \times 10^{20}/cm^3$. Moreover, it may be expected that a higher concentration of electrons has been achieved by delaying the start time instant ts for more than ten seconds.

Sixth Embodiment

In the sixth embodiment, a pn junction is formed on a single crystal silicon substrate to manufacture a semiconductor device. In order to manufacture the semiconductor device, an n-type semiconductor is at first deposited on a silicon substrate 4 by repeating the unit process of the third embodiment 1000 times. Thereafter, a p-type semiconductor is deposited on the n-type semiconductor by repeating the unit process of the fourth embodiment 1000 times. Thus, the silicon carbide semiconductor is obtained which has the silicon substrate 4 and a silicon carbide semiconductor on the silicon substrate 4. The silicon carbide semiconductor has a thickness of 54 μm and the pn junction. A deposition or formation time lasts for 5.6 hours and the deposition conditions are similar to those mentioned in conjunction with the third and the fourth embodiments except for repetition times for deposition.

Subsequently, the silicon substrate of the single crystal is removed by the use of a mixed solution of HF and $HNO_3$ with the silicon carbide alone left. Thus, the silicon carbide has an upper surface and a lower surface on which the p-type and the n-type semiconductors are exposed. Electrodes of Ni are evaporated on the upper and the lower surfaces and thereafter, electrical conductors are bonded to the respective electrodes. In this situation, a capacitance between the pn junction is measured with a d.c. voltage impressed between the electrical electrodes. Specifically, the d.c. voltage falls within a range between −10 volts and +10 volts and an a.c. voltage of 0.2 volt is impressed between the electrical electrodes. A variation of the capacitance relative to the impressed voltage has shown that a built-in potential of the pn junction thus manufactured becomes equal to 1.5 volts and an impurity gradient in the pn junction becomes equal to $1.4 \times 10^{24}/cm^4$. In addition, when a voltage is impressed between the pn junction with the upper and the lower electrodes given minus and plus voltages, respectively.

Seventh Embodiment

According to the seventh embodiment, silicon carbide is manufactured by the sublimation and recrystallization method by using, as a seed crystal, the silicon carbide mentioned in each method of the above embodiments. At first, let the method according to the seventh embodiment of this invention use the fifth embodiment mentioned above to form a first seed crystal of silicon carbide of a cubic system.

Specifically, the first seed crystal is deposited on a silicon substrate of a cubic system having a diameter of 6 inches and has therefore a diameter of 6 inches. The first seed crystal of the silicon carbide is deposited by selecting the flow rate fn and the start time instant ts (FIG. 7) such that the silicon carbide has resistivity of 0.001 Ωcm. Likewise, a second seed crystal of the silicon carbide which has resistivity of 50 Ωcm is formed on a silicon substrate of 6 inches in diameter by selecting the flow rate fn and the start time instant ts. The second seed crystal also has a diameter of 6 inches.

Next, a crucible of graphite is prepared which enters powder of SiC on its bottom. Each of the above-mentioned substrates with the first and the second seed crystals is placed downwards in the crucible with the first and the second seed crystals faced towards the SiC powder. Under the circumstances, the SiC powder and each of the substrates are heated to temperatures of 2400° C. and 2000° C., respectively. In consequence, the SiC powder is sublimated and recrystallized on each of the substrates to form a recrystallized SiC layer. In this case, a space or a gap between each surface of the substrates and the SiC power surface is equal to 100 mm and a deposition rate of SiC is 0.5 mm/hr.

Thus, the SiC layer is deposited to a thickness of 10 mm and is etched at a temperature of 500° C. by the use of fused KOH for ten minutes. Thereafter, an etch pit density has been measured in connection with the first and the second substrates. As a result of the measurement, it has been found out that the etch pit density of the first seed crystal (which has the resistivity of 0.005 Ωcm) is not greater than $10/cm^2$ while that of the second seed crystal (which has the resistivity of 50 Ωcm) is as large as $3500/cm^2$. From this fact, it is readily understood that a defect density can be remarkably reduced when the resisitivity of the seed crystal, such as the first seed crystal, is extremely low. As a result, it is possible to obtain a high-quality silicon carbide ingot of a cubic system that has a diameter of 6 inches and a thickness of 10 mm. This might be because adhesion of particles (mainly, silicon carbide powder used as a raw material) can be suppressed due to static electricity during the sublimation and recrystallization.

For comparison, sublimation and recrystallization have been made to deposit SiC layer on a substrate which is known and sold as 6H—SiC (micro-pipe concentration of $100/cm^2$, a diameter of 2 inches, and resistivity of 40 Ωcm). The resultant etch pit density was as large as $1000/cm^2$ and the particle number was as many as $3000/cm^2$.

As mentioned above, the pn junction according to this embodiment has a sharp or steep concentration gradient over $10^{24}/cm^4$. The impurity concentration can be controlled and varied within the range between $1\times10^{14}$ and $1\times10^{21}/cm^3$, as described in conjunction with the fifth embodiment. This shows that the concentration gradient can be also controlled within a range between $10^{17}/cm^4$ and $10^{24}/cm^4$ and a breakdown voltage in the pn junction of the semiconductor device can be controlled within a wide range between 3 and 10000 volts.

Thus, this invention can carry out the impurity concentration control over a wide range and the impurity concentration gradient with a high precision, which makes it possible to control a built-in potential and the breakdown voltage with a high precision.

The impurities according to this invention may not be restricted to $N_2$, $BCl_3$ but may be all the impurities that can be diffused into the silicon. At any rate, the merit of this invention can be obtained without any restriction of the impurities, if they can be diffused into the silicon. In addition, using $SiH_2Cl_2$ and $C_2H_2$ gases as raw materials of the silicon carbide has been described in the above-mentioned embodiments. However, any other carbon sources may be combined with one another, if they can carbonize the silicon.

In the above-embodiments, although the growth temperature of the silicon carbide has been assumed to be 1200° C., this invention may be effectively applicable if the growth temperature is not lower than 900° C. The gas supply time during the growth of the silicon carbide may not be limited to the above-mentioned embodiments but the gas supply time duration and the gas introduction repetition times may be selected in consideration of the thickness of the silicon carbide. This invention is also effective regardless of any crystal phase of the silicon carbide. In other words, the crystal phase of the silicon carbide may be of a hexagonal system or a rhombohedral system instead of the cubic system.

In the above-mentioned embodiments, although description has been made only about the vapor deposition method, this invention is also applicable to liquid deposition. In this event, the liquid deposition is started by at first attaching a substrate surface to fused silicon solution to deposit a silicon layer on the substrate surface. Thereafter, the silicon layer is exposed to an atmosphere of an impurity (for example, an impurity vapor phase atmosphere or a fused silicon solution including the impurity) to diffuse the impurity into the silicon layer. Subsequently, the silicon surface doped with the impurity is exposed in an atmosphere of silicon carbide. Thus, the above-mentioned liquid deposition can also attain a merit similar to the vapor deposition and can optionally accomplish the impurity concentration gradient between $1\times10^{18}/cm^4$ and $4\times10^{24}/cm^4$, differing from the above-mentioned impurity concentration gradient of $1.4\times10^{24}/cm^4$.

Hereinafter, conventional manufacturing methods will be exemplified as comparative examples in order to be compared with the embodiments according to this invention.

FIRST COMPARATIVE EXAMPLE

Figure 8:
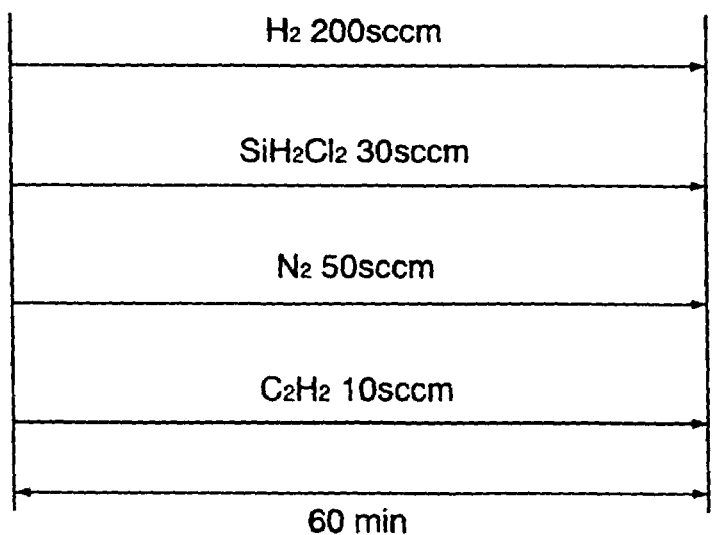
FIG. 8 shows a timing diagram for use in describing a silicon carbide manufacturing method according to a first comparative example.

The first comparative example is similar to the above-mentioned first embodiment according to this invention except that a unit process is different from that of the first embodiment. As shown in FIG. 8, the first comparative example deposits a silicon carbide layer by simultaneously and continuously supplying $H_2$ gas, $SiH_2Cl_2$ gas, $N_2$ gas, and $C_2H_2$ gas for sixty minutes into a deposition chamber. This shows that the silicon carbide deposition and the impurity doping are simultaneously carried out in the first comparative example. A total amount of each gas is identical with that of the first embodiment.

Thus, the silicon carbide semiconductor film of the cubic system is deposited on a single crystal silicon substrate to a thickness of 77 μm. When the impurity included in the silicon carbide grown on the silicon substrate was measured by the SIMS (secondary ion mass spectrometer), it has been found out that the impurity or nitrogen concentration in the silicon carbide is as low as $3.2\times10^{16}/cm^3$ and is uniformly distributed within the silicon carbide. In addition, the concentration of electrons measured by the Hall effect was equal to $2.7\times10^{16}/cm^3$ and the resistivity of the silicon carbide was 0.42 Ωcm. Moreover, the variation of the impurity concentration was spread over regions of 8.2% in plane and in a thickness direction.

On the other hand, the first embodiment is different from the first comparative example in that the carbonization process is executed after the deposition process and the doping process are simultaneously carried out. Comparison between the first embodiment and the first comparative example shows the fact that the impurity concentration according to the first embodiment is remarkably higher that that of the first comparative example by more than three digits and the resistivity of the silicon carbide according to the first embodiment is very lower than that of the first comparative example.

SECOND COMPARATIVE EXAMPLE

Figure 9:
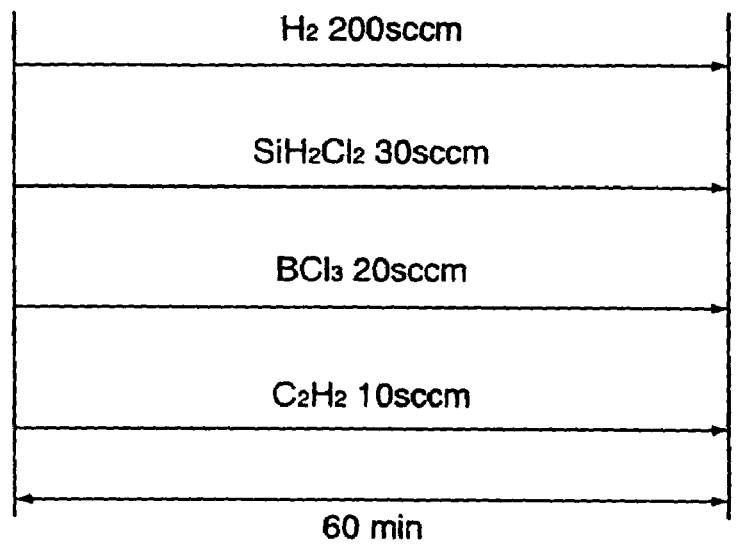
FIG. 9 shows a timing diagram for use in describing a silicon carbide manufacturing method according to a second comparative example.

The second comparative example executes processing in accordance with a timing diagram illustrated in FIG. 9. As shown in FIG. 9, the second comparative example is similar to the first comparative example except that $BCl_3$ gas is supplied at the flow rate of 20 sccm, instead of the $N_2$ gas. In other words, the second comparative example dopes boron (B) as acceptors into the silicon layer in lieu of doping nitrogen (N) as donors. Therefore, the remaining processes are similar to those illustrated in FIG. 8 and will not be described any longer.

At any rate, the silicon carbide layer of the cubic system is deposited to a thickness of 77 μm on a silicon substrate. As a result of measuring the impurity in the silicon carbide grown on the silicon substrate by the SIMS, it has been found that the boron (B) is uniformly distributed in the silicon carbide and the boron (B) concentration is as low as $2.2 \times 10^{16}/cm^3$. The concentration of holes in the silicon carbide was equal to $7.5 \times 10^{15}/cm^3$ when it was measured by the use of the Hall effect while the resistivity of the silicon carbide was 1.75 μcm. The variation of the impurity concentration was 8.2% in plane and in the thickness direction.

The above-mentioned results show that the impurity concentration of the silicon carbide manufactured by the second comparative example is lower by more than three digits than the impurity concentration of the silicon carbide manufactured by the fourth embodiment which is illustrated in FIG. 5 and which carries out the carbonization process after the silicon deposition process and the impurity doping process are both continuously executed. In addition, it is also noted that the resistivity of the silicon carbide according to the second comparative example is very higher than that of the silicon carbide according to this invention.

THIRD COMPARATIVE EXAMPLE

Figure 10:
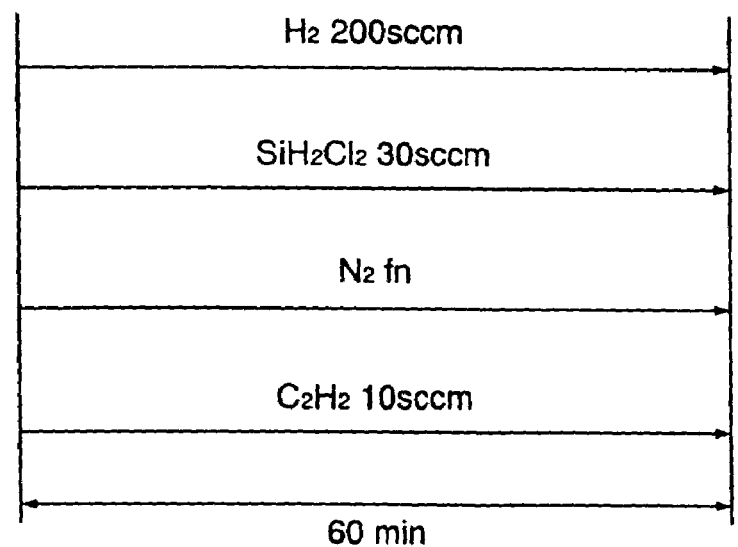
FIG. 10 shows a timing diagram for use in describing a silicon carbide manufacturing method according to a third comparative example.

Referring to FIG. 10, description will be made about a silicon carbide manufacturing method and silicon carbide according to a third comparative example. The method illustrated in FIG. 10 is similar to the first comparative example illustrated in FIG. 8 except that the flow rate (fn) of $N_2$ gas is changed in FIG. 10 to deposit various kinds of silicon carbide semiconductors. Therefore, detail description will be omitted in connection with the manufacturing method according to the third comparative example.

Figure 11:
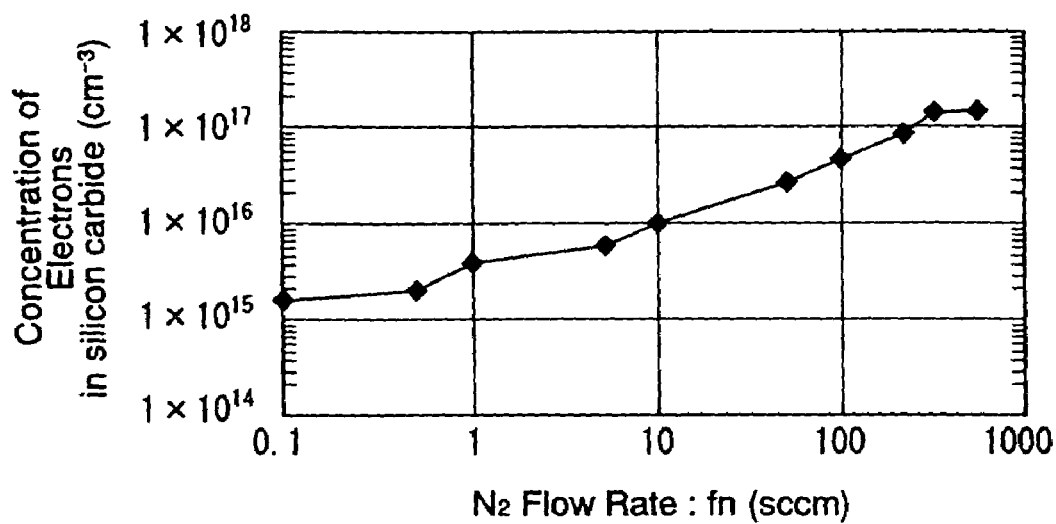
FIG. 11 is a graph which represents concentrations of electrons included in silicon carbide obtained by varying the flow rates.
Figure 12:
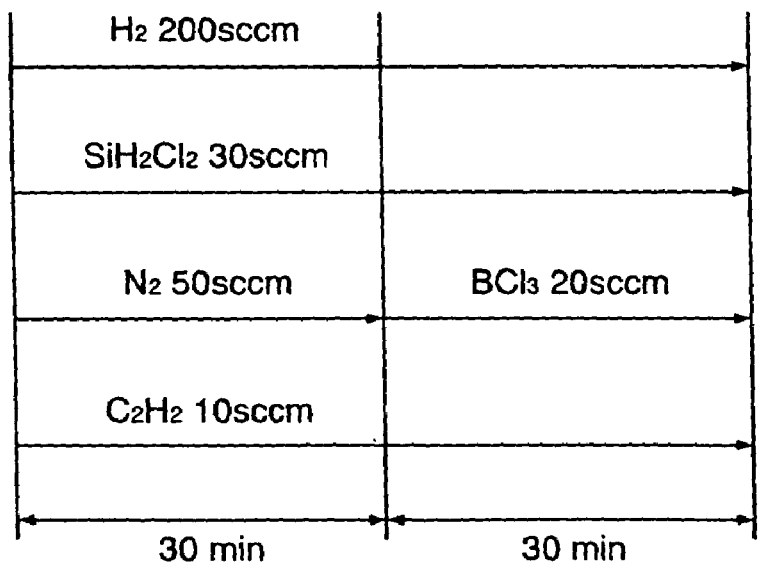
FIG. 12 shows a timing diagram for use in describing a silicon carbide manufacturing method according to a fourth comparative example.

Referring to FIG. 11, illustration is made about a graph which represents a relationship between the flow rate (fn) (sccm) and the concentration ($cm^{-3}$) of electrons. To this end, a wide variety of silicon carbide semiconductors have been manufactured by varying the flow rates (fn) so as to measure each concentration of electrons. As illustrated in FIG. 11, the concentration of electrons tends to increase with an increase of the flow rate (fn) of the nitrogen gas ($N_2$) but is not proportional to the flow rate (fn). Precisely, the increase of the concentration of electrons tends to be saturated as the fn increases. In any event, a variation of the concentration of electrons falls within a range between $1 \times 10^{13}/cm^3$ and $4 \times 10^{16}/cm^3$. The variation range is narrower than that of the above-mentioned embodiment according to this invention and is not enough to manufacture a semiconductor device.

FOURTH COMPARATIVE EXAMPLE

In the fourth comparative example, a semiconductor device is manufactured which has a pn junction deposited on a single crystal silicon substrate 4. Specifically, the n-type semiconductor is deposited for thirty minutes on the silicon substrate in accordance with the first comparative example. Subsequently, the p-type semiconductor is deposited on the n-type semiconductor for thirty minutes in accordance with the third comparative example to form a silicon carbide semiconductor of 77 μm thick on the silicon substrate 4. The pn junction is formed within the silicon carbide semiconductor. The deposition conditions are similar to those mentioned in connection with the firs and the third comparative examples except for the deposition time duration.

Thereafter, the substrate 4 (namely, the single crystal silicon substrate) is eliminated from the silicon carbide semiconductor by using a mixed solution of HF and $HNO_3$. On an upper side (p-type side) and a lower side (n-type side), electrodes of Ni are evaporated and connected to conductors. Under the circumstances, a capacitance of the pn junction is measured by impressing a d.c. voltage between −10 volts and +10 volts. Practically, the capacity measurement is executed by giving an a.c. voltage (0.2 volt) of 1 MHz to observe a variation of the capacitance relative to the impressed d.c. voltage.

The variation of the capacitance shows that the built-in potential of the pn junction manufactured above is equal to 0.92 volt and the impurity concentration gradient in the pn junction is calculated as $4.5 \times 10^{18}/cm^4$.

When the voltage is impressed to the silicon carbide with the upper and the lower electrodes given minus and plus voltages, respectively, the breakdown has taken place at a voltage of 14 volts. From this fact, it is to be noted that the built-in potential and the impurity concentration gradient according to the fourth comparative example are lower than those of the sixth embodiment of this invention while the breakdown voltage of the fourth comparative example is very higher than that of the sixth embodiment. Accordingly, the sixth embodiment according to this invention is effective to manufacture the semiconductor device which has the pn junction.

As mentioned before, this invention is concerned with a silicon carbide manufacturing method of manufacturing a silicon carbide semiconductor device by depositing a thin film on a substrate from a vapor phase or a liquid phase. As mentioned before, this invention is featured by the silicon layer deposition process of depositing the silicon layer on the substrate, the impurity doping process of doping, into the silicon layer, at least one element selected from an impurity group consisting of N, B, Al, Ga, In, P, As, Sb, Se, Zn, O, Au, V, Er, Ge, and Fe, and the carbonization process of carbonizing the doped silicon layer into a doped silicon carbide layer. This invention can realize the silicon carbide manufacturing method, the silicon carbide, and the semiconductor without any restrictions of impurity sources and impurity concentrations. In addition, the silicon carbide manufacturing method can manufacture the silicon carbide semiconductor under a high productivity and with a high yield.

What is claimed is:

1. A method of depositing a doped silicon carbide on a substrate from a vapor phase or a liquid phase, comprising, as a unit process, the following steps of:
depositing a silicon layer on the substrate;
doping the silicon layer with an impurity composed of at least one element selected from a group consisting of N, B, Al, Ga, In, P, As, Sb, Se, Zn, O, Au, V, Er, Ge, and Fe, to form a doped silicon layer; and
carbonizing the doped silicon layer into a silicon carbide layer of the silicon carbide doped with the impurity, after the depositing and the doping steps are executed,
wherein the unit process is repeated a plurality of times to deposit the silicon carbide layer to a desired thickness.

2. A method as claimed in claim 1, wherein the silicon layer depositing step, the doping step, and the carbonizing step are carried out during epitaxially growing a thin film on the substrate by the use of a chemical vapor deposition technique;
the silicon layer deposition step being carried out by using a gas of a silane group or a dichlorosilane group as a silicon raw material while the carbonizing step is carried out by the use of an unsaturated carbonhydrate gas.

3. A method as claimed in claim 1, wherein the silicon layer depositing step is followed by the doping step and the carbonizing step is carried out after the doping step.

4. A method as claimed in claim 1, wherein the silicon layer depositing step and the doping step are simultaneously carried out and are followed by the carbonizing step.

5. A method as claimed in claim 1, wherein the silicon layer depositing step and the doping step are simultaneously carried out while the carbonizing step is carried out when a predetermined time lapses after the start of both the silicon depositing and the doping steps.

6. A method as claimed in claim 1, wherein an amount of impurity is varied during each doping step of the unit processes to provide a plurality of silicon carbide layers which have different impurity concentrations in a thickness direction, respectively.

7. A method as claimed in claim 1, wherein the doping step controls an amount of impurity so that impurity concentrations in the silicon carbide fall within a range between $1 \times 10^{13}/cm^3$ to $1 \times 10^{21}/cm^3$.

8. A method as claimed in claim 1, wherein the doping step controls an amount of impurity so that an impurity concentration gradient falls within a range between $10 \times 10^{18}/cm^4$ and $4 \times 10^{24}/cm^4$ in a thickness direction of the silicon carbide layer.

9. A method as claimed in claim 1, wherein the substrate has a surface which is structured by either one of a single crystal silicon, a silicon carbide of a cubic system, and a silicon carbide of a hexagonal system while the silicon carbide layer deposited on the surface of the substrate is structured by silicon carbide of a cubic system or a hexagonal system.

10. A method of depositing a doped silicon carbide on a substrate from a vapor phase or a liquid phase, comprising, as a unit process, the following steps of:
depositing a silicon layer on the substrate;
doping the silicon layer with an impurity composed of at least one element selected from a group consisting of N, B, Al, Ga, In, P, As, Sb, Se, Zn, O, Au, V, Er, Ge, and Fe, to form a doped silicon layer; and
carbonizing the doped silicon layer into a silicon carbide layer of the silicon carbide doped with the impurity,
further comprising the step of:
removing the substrate from the silicon carbide layer after the formation of the doped silicon carbide, to leave a silicon carbide wafer.

11. A method as claimed in claim 1, wherein the doping step of each process unit is carried out by varying a species of the impurities from one to another at each process unit to provide a pn junction in the doped silicon carbide layer.

12. A method as claimed in claim 1, further comprising the step of:
using, as a seed crystal, the doped silicon carbide obtained in claim 1; and
further growing a silicon carbide on the seed crystal by a vapor deposition method, a sublimation re-crystallization method, or a liquid deposition method.

* * * * *